(12) United States Patent
Sagae et al.

(10) Patent No.: US 7,468,543 B2
(45) Date of Patent: Dec. 23, 2008

(54) SEMICONDUCTOR DEVICE, COMMUNICATION DEVICE, AND SEMICONDUCTOR DEVICE INSPECTING METHOD

(75) Inventors: Yoshitomo Sagae, Kanagawa (JP); Toshiki Seshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 444 days.

(21) Appl. No.: 10/942,849

(22) Filed: Sep. 17, 2004

(65) Prior Publication Data
US 2005/0093026 A1   May 5, 2005

(30) Foreign Application Priority Data
Sep. 19, 2003   (JP)   ............... 2003-327871

(51) Int. Cl.
*H01L 27/24*   (2006.01)
(52) U.S. Cl. .............. 257/531; 257/532; 257/528; 257/E27.004; 333/103
(58) Field of Classification Search ........... 257/531, 257/532, 528, 444, E27.004, E29.169, E29.325; 455/333; 327/430, 427, 436; 333/103
See application file for complete search history.

(56) References Cited

U.S. PATENT DOCUMENTS

| | | | | |
|---|---|---|---|---|
| 5,594,394 | A * | 1/1997 | Sasaki et al. | 333/103 |
| 5,748,053 | A * | 5/1998 | Kameyama et al. | 333/103 |
| 5,774,792 | A * | 6/1998 | Tanaka et al. | 455/78 |
| 5,900,643 | A * | 5/1999 | Preslar et al. | 257/48 |
| 6,118,985 | A * | 9/2000 | Kawakyu et al. | 455/78 |
| 6,281,762 | B1 * | 8/2001 | Nakao et al. | 333/103 |
| 6,341,216 | B1 * | 1/2002 | Itoh | 455/83 |
| 6,693,498 | B1 * | 2/2004 | Sasabata et al. | 333/103 |
| 6,720,850 | B2 * | 4/2004 | Sasabata et al. | 333/261 |
| 2002/0140609 | A1 * | 10/2002 | Aoki et al. | 343/700 MS |
| 2002/0186076 | A1 * | 12/2002 | Hareyama | 330/51 |
| 2005/0233706 | A1 * | 10/2005 | Takeda | 455/78 |

FOREIGN PATENT DOCUMENTS

| | | |
|---|---|---|
| JP | 2-108301 | 4/1990 |
| JP | 5-252016 | 9/1993 |
| JP | 6-152361 | 5/1994 |
| JP | 7-303001 | 11/1995 |
| JP | 8-228138 | 9/1996 |
| JP | 10-308602 | 11/1998 |
| JP | 11-027122 | * 1/1999 |
| JP | 11-27122 | 1/1999 |

* cited by examiner

*Primary Examiner*—Theresa T Doan
*Assistant Examiner*—Sarah K Salerno
(74) *Attorney, Agent, or Firm*—Oblon, Spivak, McClelland, Maier & Neustadt, P.C.

(57) ABSTRACT

A semiconductor device comprises a semiconductor switching element having a first electrode, a second electrode and a third electrode, and permitting a high-frequency signal to pass through between the first electrode and the second electrode, depending upon the potential of the third electrode, bias voltages at the first and second electrodes being substantially equal; and an inductor element and a capacitor element which are connected in parallel with respect to the semiconductor switching element at the first and second electrodes and are connected in series to each other.

18 Claims, 14 Drawing Sheets

SEMICONDUCTOR DEVICE, COMMUNICATION DEVICE, AND SEMICONDUCTOR DEVICE INSPECTING METHOD

CROSS-REFERENCE TO RELATED APPLICATION

This application is based upon and claims the benefit of priority from the prior Japanese Patent Application No. 2003-327871, filed on Sep. 19, 2003, the entire contents of which are incorporated herein by reference.

BACKGROUND OF THE INVENTION

1. Field of the Invention

The present invention relates to a semiconductor device, communication device, and a method of inspecting a semiconductor device.

2. Related Background Art

Along with the movement toward low-power-consuming mobile communication devices for two-way communications of high-frequency (also referred to as "radio-frequency" or "RF" hereunder wherever appropriate) signals, there is a demand to reduce the insertion loss of a high-frequency (RF) switch circuit provided between an antenna and transmission/reception circuit or between an antenna and a reception circuit and to reduce the power consumption of the switch circuit itself. On this account, the switching element should preferably be of a lower insertion-loss type that needs no DC bias current, like a diode. Currently, HEMT (high electron mobility transistor), one of the high-performance FETs (field effect transistors), is employed as this type of switching element because a high-frequency switch circuit composed of an HEMT consumes little power and exhibits high isolation properties and small insertion loss. Currently available high-frequency switch circuits are shunt-type ones and resonant-type ones (see JP-H06-152361-A).

FIG. 13 is a circuit diagram of a typical conventional shunt-type SPST (single-pole single-throw) switch circuit. This shunt-type switch circuit includes two FETs (simply called "transistors" hereunder) T1 and T2 to switch RF signals. In pre-shipment inspection of a product including the shunt-type switch, the transistors T1 and T2 are normally checked in terms of DC (direct current) characteristic to judge acceptability of the transistors T1 and T2. This is because transistors, in general, including those used with RF signals, can be verified for acceptability by inspection of DC characteristics without inspection of RF characteristics.

FIG. 14 is a circuit diagram of a typical conventional resonant-type SPST switch circuit. The resonant-type switch circuit includes a transistor T3 as a switching element, and an inductor L1 connected in parallel to the transistor T3. Resonant-type switch circuits, in general, are superior to shunt-type switch circuits in isolation property for RF signals.

However, pre-shipment inspection of products including resonant-type switch circuits cannot check DC characteristics of the transistor T3 because the inductor L1 connected between the source and drain of the transistor T3 makes a short-circuit for DC current between the source and the drain. Therefore, in pre-shipment inspection of products including resonant-type switch circuits, the resonant circuit composed of the transistor T3 and the inductor L1 must be inspected in terms of RF characteristics in order to judge the acceptability of the transistor T3. This means that an inspection apparatus dedicated to checking RF characteristics must be used in the inspection process. Accordingly, it has been a problem that inspection of products including resonant-type switch circuits is more expensive than inspection of products including shunt-type switch circuits.

SUMMARY OF THE INVENTION

A semiconductor device comprises a semiconductor switching element having a first electrode, a second electrode and a third electrode, and permitting a high-frequency signal to pass through between the first electrode and the second electrode, depending upon the potential of the third electrode, bias voltages at the first and second electrodes being substantially equal; and an inductor element and a capacitor element which are connected in parallel with respect to the semiconductor switching element at the first and second electrodes and are connected in series to each other.

A communication device comprises an antenna; a first semiconductor switching element having a first electrode, a second electrode and a third electrode, and permitting a high-frequency signal received at the first electrode through the antenna to pass through to the second electrode, depending upon the potential of the third electrode, bias voltages at the first and second electrodes being substantially equal; a first inductor element and a first capacitor element which are connected to the first and second electrodes in parallel with respect to the first semiconductor switching element and are connected in series to each other; a received signal amplifier which amplifies the received signal supplied from the second pole; a transmission signal amplifier which amplifies a high-frequency transmission signal; a second semiconductor switching element having a fourth electrode, a fifth electrode and a sixth electrode, and permitting the transmission signal introduced from the transmission signal amplifier to the fourth electrode to pass through to the fifth electrode, depending upon the potential of the sixth electrode, and further from the fifth electrode to the antenna, bias voltages at the fourth electrode and the fifth electrode being substantially equal; and a second inductor element and a second capacitor element which are connected in parallel to the second semiconductor switching element and are connected in series to each other.

A method of inspecting a semiconductor device including a semiconductor switching element having first to third electrodes to permit or prohibit a high-frequency signal to pass through between the first and second electrodes, depending upon the potential at the third electrode, in which bias voltages at the first and second electrodes are substantially equal to each other, and including an inductor element and a capacitor element which are connected in parallel to the semiconductor switching element at the first and second electrodes and are connected in series to each other, comprises applying a DC voltage to the first to third electrodes; and measuring resistance values or current values between the first and second electrodes in both ON and OFF states of the switching element, respectively.

DETAILED DESCRIPTION OF THE INVENTION

Some embodiments of the invention will be described below in detail with reference to the drawings. It should be noted, however, that the invention is not limited to the embodiments. The semiconductor devices according to the embodiments of the invention each include a field effect transistor (FET) (simply called transistors hereunder), as well as an inductor and a capacitor that are connected in parallel to the transistor and connected in series to each other. Thus, the semiconductor device can be inspected in characteristics of its transistor by conducting a DC characteristic test without checking its RF characteristics.

FIRST EMBODIMENT

Figure 1:
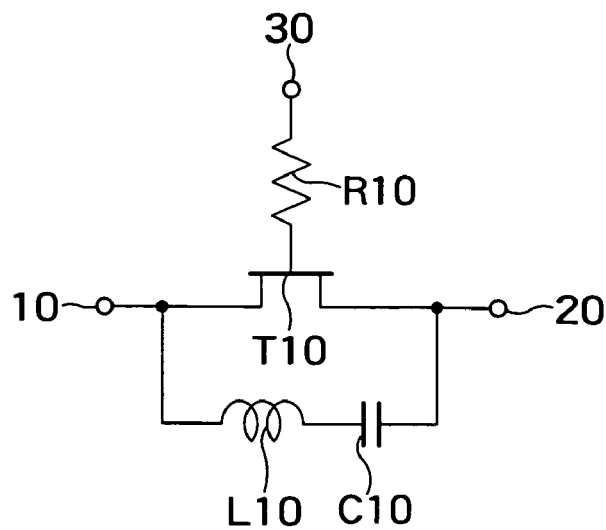
FIG. 1 is a circuit diagram of a resonant-type SPST (single-pole single-throw) switch circuit 100 according to the first embodiment of the invention.

FIG. 1 is a schematic circuit diagram of a resonant-type SPST (single-pole single-throw) switch circuit 100 (simply called "switch circuit 100" hereunder) according to the first embodiment of the invention. The switch circuit 100 includes a transistor T10, inductor L10, capacitor C10 and a resistor R10.

The transistor T10 is a field effect transistor such as, for example, HEMT (high electron mobility transistor). The transistor T10, in normal use, permits an RF signal to pass from a terminal 10 connected to the drain of the transistor T10 to a terminal 20 connected to the source depending upon the potential at a terminal 30 connected to the gate. Alternatively, the transistor T10 interrupts an RF signal from the terminals 10 and 20 depending upon the potential on the terminal 30. In this situation, bias voltages at the terminals 10 and 20 are substantially equal.

One end of the inductor L10 is connected to the drain of the transistor T10, and the other end thereof is connected to one end of the capacitor C10. The other end of the capacitor C10 is connected to the source of the transistor T10. Thus, the inductor L10 and capacitor C10 are connected in series to each other and connected in parallel between the source and drain of the transistor T10. The resistor R10 is connected to the gate of the transistor T10.

Since the capacitor C10 is connected between the inductor L10 and source of the transistor T10 as explained above, the DC current flowing toward the inductor L10 is interrupted. More specifically, no DC signals supplied between the terminals 10 and 20 can flow between the terminals 10 and 20 unless they pass through the transistor T10. The capacitor C10 can be implemented with an MIM (metal-insulator-metal) capacitance, for example.

Figure 2:
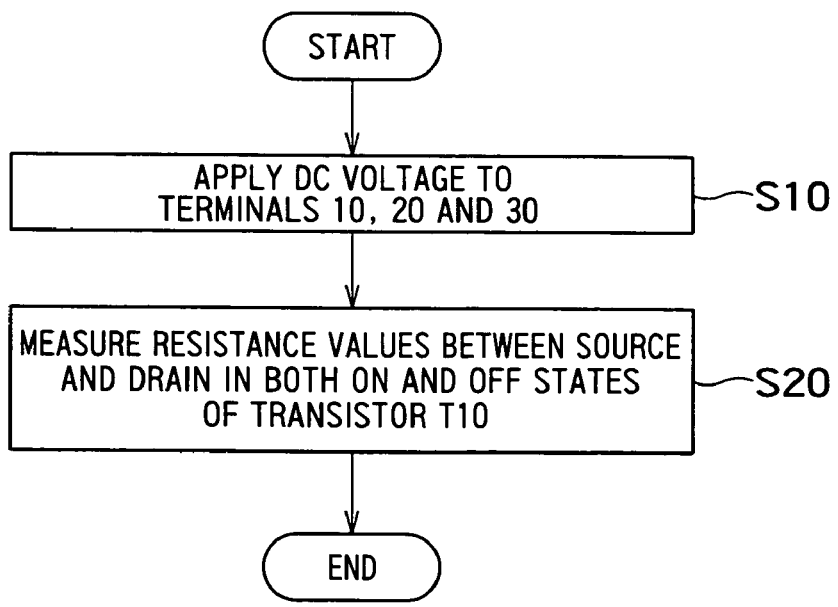
FIG. 2 is a flowchart showing the flow of a method of inspecting the switch circuit 100.

FIG. 2 is a flowchart showing the flow of a method of inspecting the switch circuit 100. First, a DC voltage is applied to the terminals 10, 20 and 30 (S10). In ON state of the transistor T10, resistance between the source and drain is measured. In addition, in OFF state of the transistor T10, resistance between the source and drain is measured (S20). Instead of resistance values between the source and drain of the transistor T10, current values may be measured alternatively. Other DC characteristics of the transistor T10 are measured as well. Thereby, acceptability of the switch circuit 100 can be determined.

Since the capacitor C10 interrupts the flow of DC current to the inductor L10, DC characteristics of the transistor T10 can be measured as explained above. That is, the switch circuit 100 according to the first embodiment is of the resonant type, but nevertheless, the transistor T10 can be checked using the DC signal in the inspection process of the semiconductor device. Therefore, the instant embodiment needs no dedicated inspection apparatus for checking the RF characteristic, and can reduce the manufacturing cost of the semiconductor device greatly.

Figure 3:
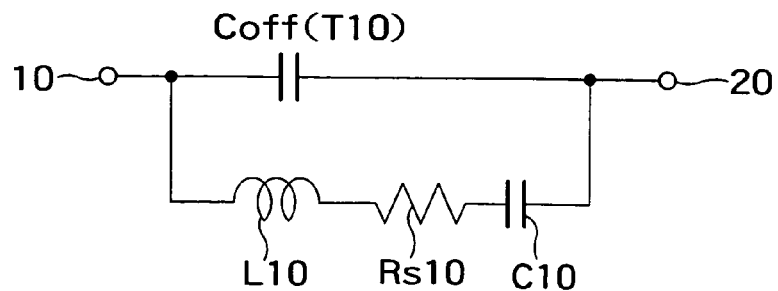
FIG. 3 shows an equivalent circuit of the switch circuit 100 according to the first embodiment in its OFF state.
Figure 4:
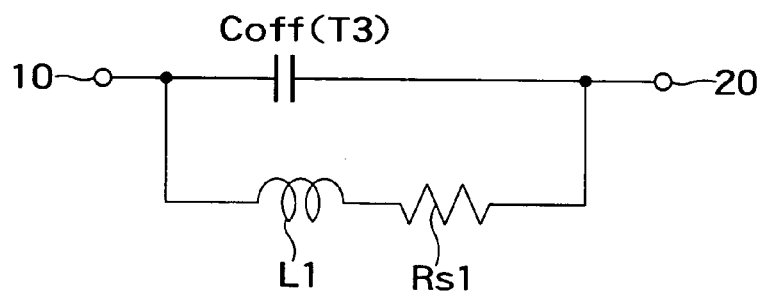
FIG. 4 shows an equivalent circuit of the conventional resonant-type switch circuit shown in FIG. 14 in its OFF state.
Figure 14:
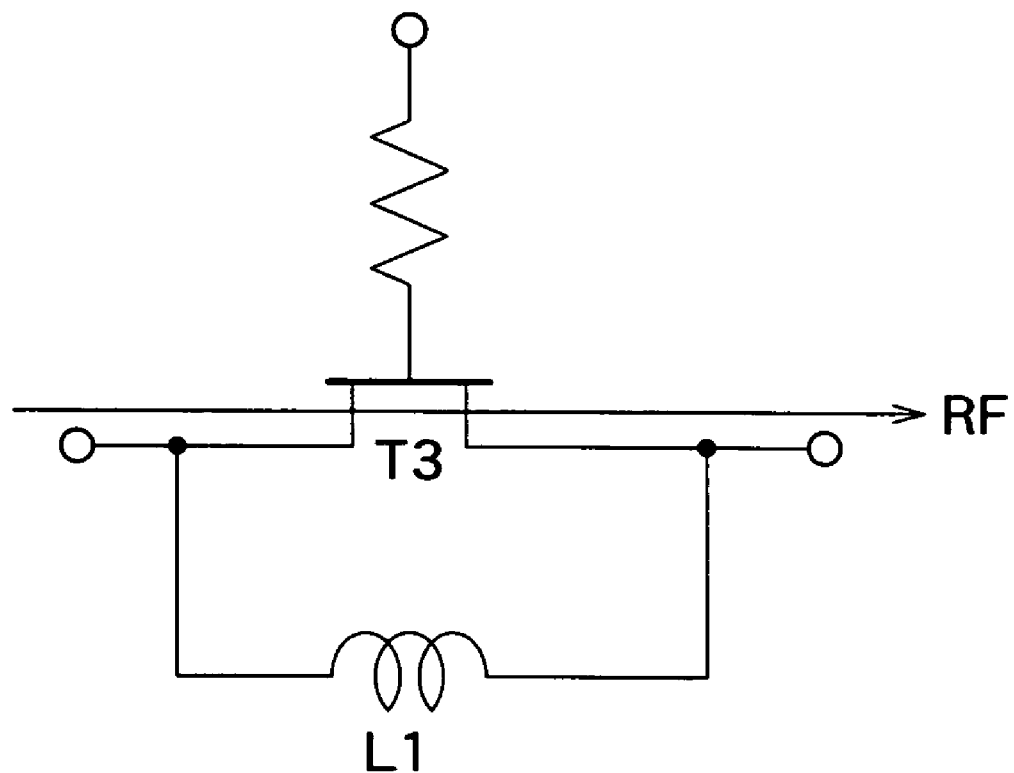
FIG. 14 is a circuit diagram of a typical conventional resonant-type SPST switch circuit.

FIG. 3 shows an equivalent circuit in OFF state of the switch circuit 100 according to the first embodiment. FIG. 4 shows an equivalent circuit in OFF state of the conventional resonant-type switch circuit shown in FIG. 14. In the equivalent circuit, the transistor T10 is shown as the parasitic capacitance $C_{off}(T10)$ (hereinafter called "off capacitance $C_{off}(T10)$") between the source and drain thereof, and the transistor T3 is shown as the parasitic capacitance $C_{off}(T3)$ (hereinafter called "off capacitance $C_{off}(T3)$") between the source and drain thereof.

Figure 5:
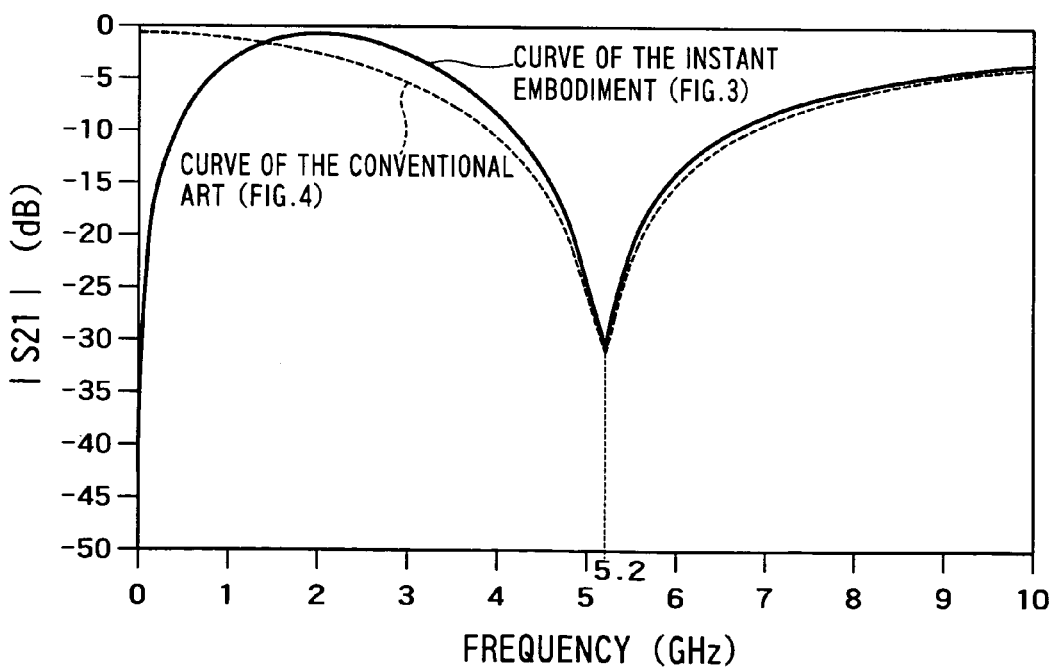
FIG. 5 is a graph in which the switch circuit 100 according to the first embodiment and the conventional resonant-type switch circuit are compared in isolation characteristic.

FIG. 5 is a graph showing isolation characteristics of the switch circuit 100 according to the first embodiment and those of the conventional resonant-type switch circuit for the purpose of comparison. This graph shows a result of a simulation by measurement of isolation characteristics using the equivalent circuits shown in FIGS. 3 and 4. The graph shows the isolation characteristics in transfer constant of electrical transfer between the terminals 10 and 20 when the transistor T10 or T3 is in OFF state, that is, in so-called S-parameter (|S21|).

The simulation of the equivalent circuit in FIG. 3 was based on the following conditions: the ON resistance of the transistor T10 being 4 Ω upon the gate voltage being 0 V; the OFF capacitance $C_{off}(T10)$ of the transistor T10 being 187 fF upon the gate voltage being −3 V; the switch circuit 100 being designed for 5.2 GHz; and the resonant frequency of the equivalent circuit in FIG. 3 being 5.2 GHz. The capacitor C10 was assumed to have the capacitance of 1 pF. In case the capacitor C10 of 1 pF is an MIM capacitor, it can be added to the switch circuit 100 with almost no increase of area of the switch circuit 100.

Under those conditions, the inductance of the inductor L10 was 5.96 nH. The inductance was designed in form of a square spiral of a gold interconnection, which was 1.2 µm in thickness, 15 µm in line width, and had the inter-line space of 5 µm. Then, the inductor L10 had a length around 295 µm each side and had 4.75 wire turns. Interconnection resistance of the inductor L10, with the skin effect taken into account, was 8.74 Ω. This interconnection resistance was incorporated as a parasitic resistance Rs10 of the inductor L10 in the conditions of the simulation. As a result, the isolation characteristic of the switch circuit 100 was |S21|=−30 dB at around 5.2 GHz as shown in FIG. 5.

The simulation of the equivalent circuit in FIG. 4 was based on the following conditions: the resonant frequency of the equivalent circuit being 5.2 GHz here again; the ON resistance and the OFF resistance of the transistor T3 being equal to the conditions of the transistor 10. Under those conditions, the inductance of the inductor L1 was 5.02 nH. This inductor L1 was designed in the form of a square spiral of a gold interconnection similar to that used in the inductor L10. Then, the inductor L1 had a length around 273 µm each side, and had 4.75 wire turns. Wiring resistance of the inductor L1, with the skin effect taken into account, was 7.8 Ω. This wiring resistance was incorporated as a parasitic resistance Rs1 of the inductor L1 in the conditions of the simulation. As a result, the isolation characteristic of the conventional resonant-type switch circuit 100 was |S21|=−31 dB at around 5.2 GHz as shown in FIG. 5.

It has been confirmed from these results that deterioration of the switch circuit 100 according to the instant embodiment is as small as 1 dB as compared with the conventional resonant-type switch circuit. This means that the switch circuit 100 has isolation characteristics of the same level as those of the conventional resonant-type switch circuit.

It is noted that the switch circuit 100 shows a large difference in isolation characteristics from the conventional resonant-type switch circuit in the low-frequency signal range, as shown FIG. 5. In the high-frequency signal range, however, the switch circuit 100 is nearly equal in isolation characteristics to the conventional resonant-type switch circuit. This is because the impedance of the capacitor C10 is large for low-frequency signals but it becomes smaller as the frequency of signals becomes higher. Therefore, the switch circuit 100 should preferably be used with higher-frequency signals in practical applications. However, if the capacitor C10 is enhanced in capacitance, the switch circuit 100 will be usable with lower-frequency signals as well.

Further, the equivalent circuit shown in FIG. 3 was simulated, decreasing the OFF capacitance of the capacitor C10 to 0.1 pF, which is smaller than the OFF capacitance $C_{off}(T10)$, under the same conditions in the other respects. In this case, the inductor L10' showed an inductance of 14.4 nH. The inductance L10' was designed in form of a square spiral of a gold interconnection similar to that of the inductor L10 in the preceding design already explained. Then, the inductor L10' had a length of about 400 µm per side and had 7 wire turns. In this case, although the inductor L10' exhibited isolation characteristics of −30 dB here again, the inductor L10', in which the capacitor C10 of 0.1 pF was used, had an area about 1.8 times larger than that of the inductor L10 in which the capacitor C10 of 1 pF was used. Therefore, in order to reduce the area of the switch circuit 100, the capacitor C10 should preferably have an OFF capacitance larger than $C_{off}(T10)$.

Although the switch circuit 100 according to the first embodiment has an isolation characteristic nearly equal to that of the conventional resonant-type switch circuit, the transistor T10 included therein can be checked by measuring the DC characteristic. That is, although the switch circuit 100 is a resonant type circuit, it can be inspected by the DC characteristic measurement like the shunt-type switch circuit, and does not required RF measurement that has been indispensable for examination of conventional resonant-type switch circuits. Thus, the cost of the RF evaluation, having heretofore shared the majority of the product cost, can be eliminated.

Note here that capacitors and inductors are superior to transistors in reproducibility in their manufacture. Therefore, once the transistor is proved acceptable or not by measurement of DC characteristics of the transistor, the entire switch circuit is substantially proved acceptable or not. Additionally, since evaluation of switching elements for RF signals by examination of DC characteristics is actually employed for inspection of shunt-type switch circuits, this way of inspection has already been proved reliable.

The capacitor C10 and inductor L10 may be swapped in physical relationship in the first embodiment explained above, without losing the effects of this embodiment. The same effects are assured also even when the drain and the source of the transistor T10 are swapped in physical relationship.

Note here that the circuit including the capacitor and inductor that are connected in series to each other and in parallel to a bipolar transistor and a diode is already known in the art (see JP-H11-27122-A and JP-H10-308602-A). In any of these known circuits, the capacitor is indispensable to make a difference in bias between opposite ends of the bipolar transistor or the diode in normal use of the circuit. Therefore, without the capacitor, such circuits do not operate normally.

According to this embodiment, however, the switch circuit 100 does not need the capacitor C10 in its normal use, because bias voltages at the electrodes 10 and 20 are substantially equal in a normal operation. Therefore, the switch circuit 100 will operate normally without the capacitor C10. The inventor, however, has remarked that, when the capacitor C10 is added regardless of its uselessness in normal use of the circuit, the cost for the inspection process can be reduced. That is, although the first embodiment is certainly similar in construction to the known circuits, it is significantly different from the known circuits in concept and effects.

SECOND EMBODIMENT

Figure 6:
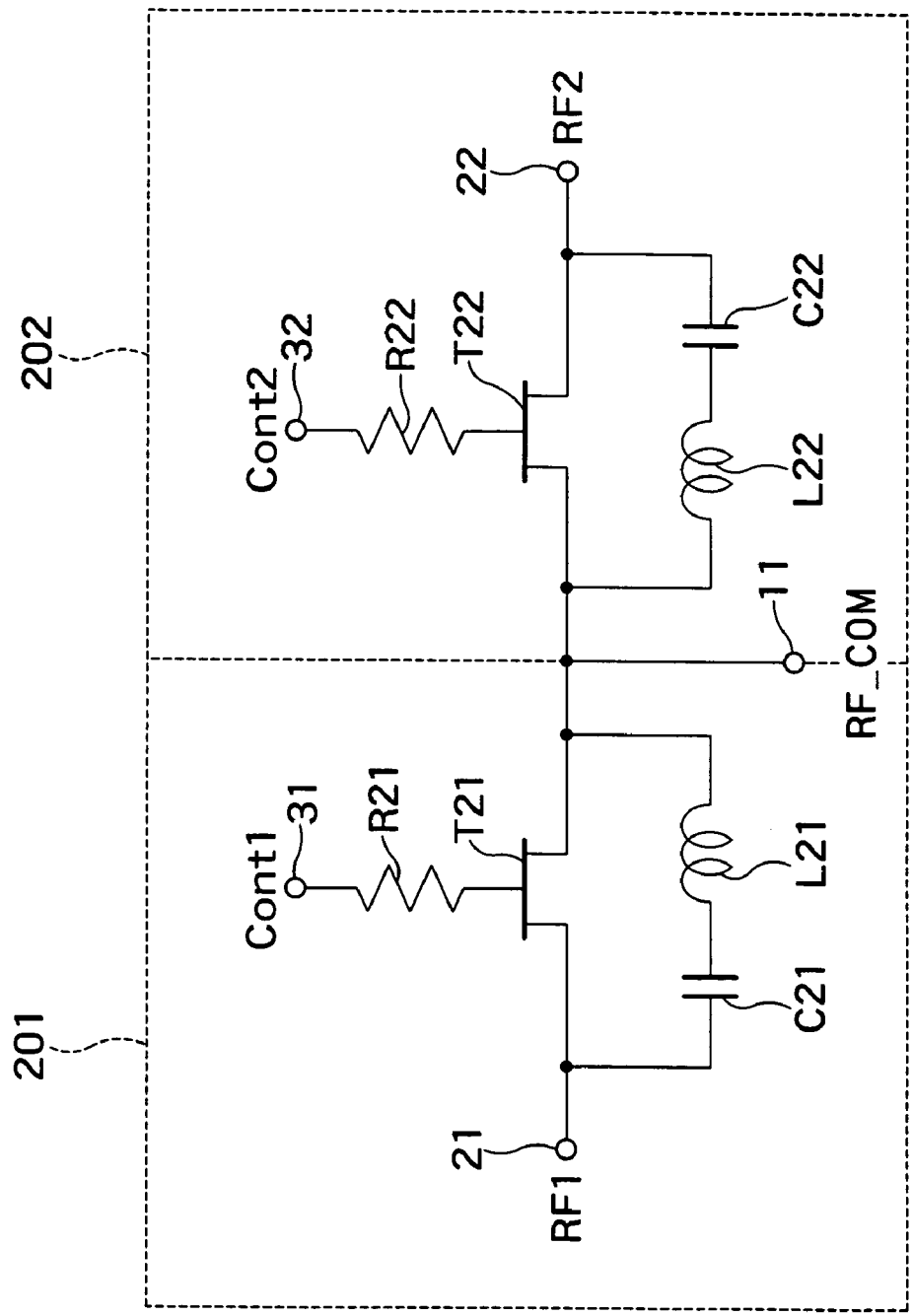
FIG. 6 is a circuit diagram of a resonant-type SPDT (single-pole double-through) switch circuit according to the second embodiment of the invention.

FIG. 6 is a circuit diagram of a resonant-type SPDT (single-pole double-though) switch circuit 200 (simply called "switch circuit 200" hereunder) according to the second embodiment of the invention. The switch circuit 200 is composed of two circuit sections 201 and 202, each having the same configuration as the switch circuit 100. The circuit sections 201 and 202 commonly use a terminal 11. The circuit sections 201 and 202 include transistors T21 and T22, respectively, each corresponding to the transistor T10 in the switch circuit 100 already explained according to the preceding embodiment. Their inductors L21 and L22 each correspond to the inductor L10 in the switch circuit 100, and their capacitors C21 and C22 each correspond to the capacitor C10 in the switch circuit 100. Furthermore, their resistors R21 and R22 each correspond to the resistor R10 in the switch circuit 100.

The switch circuit 200 introduces a signal RF_COM through the terminal 11, and outputs a signal RF1 or RF2 from a terminal 21 or 22 thereof in response to a control signal Cont1 or Cont2. Alternatively, the switch circuit 200 introduces the signal RF1 or RF2 through the terminal 21 or 22, and outputs the signal RF_COM from the terminal 11 in response to the control signal Cont1 or Cont2.

Since the capacitor C21 is provided in the circuit division 201, the flow of DC current to the inductor L21 is blocked. That is, DC signals supplied between the terminals 11 and 21 cannot flow between the terminals 11 and 21 unless they pass through the transistor T21. Additionally, since the capacitor C22 is provided, the flow of DC current to the inductor L22 is blocked. That is, when DC signals are applied between the terminals 11 and 22, they cannot flow between the terminals 11 and 22 unless they pass through the transistor T22.

Figure 7:
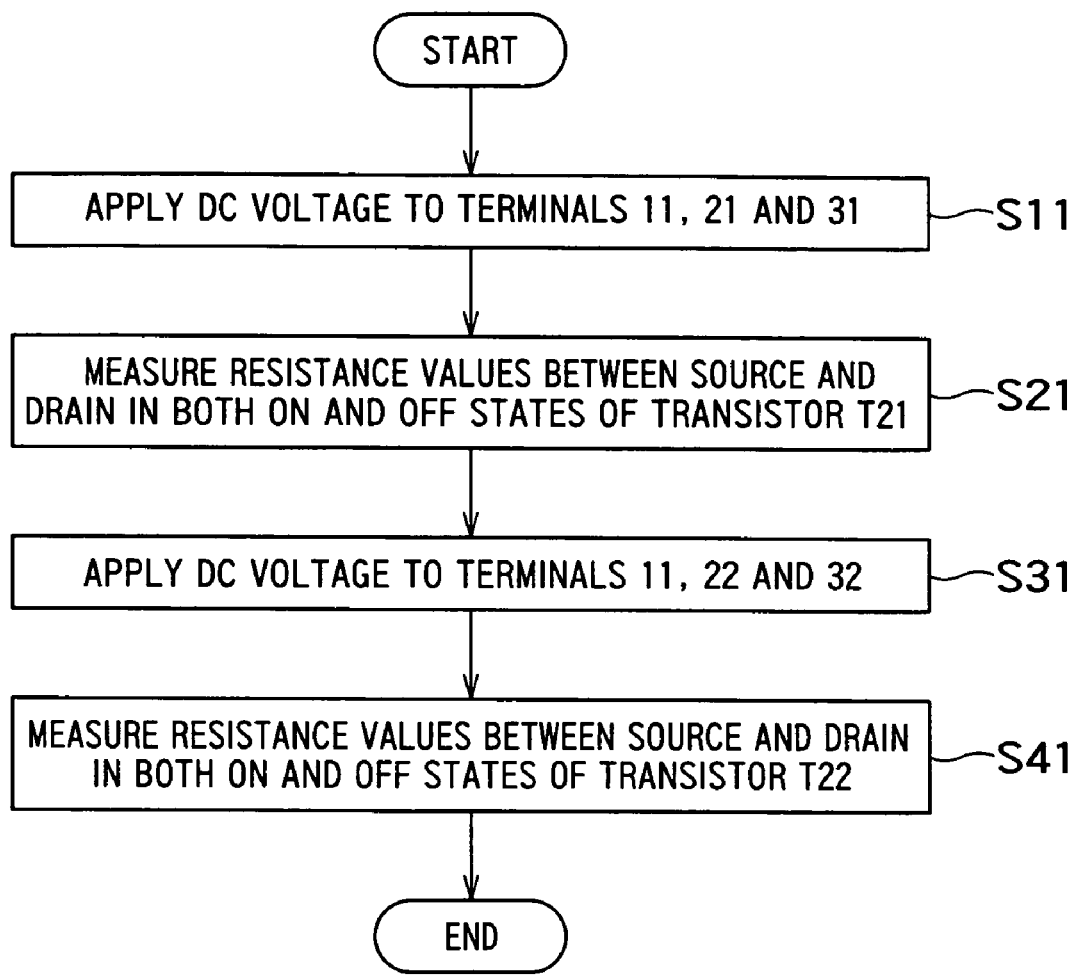
FIG. 7 is a flowchart showing the flow of a method of inspecting the switch circuit 200.

FIG. 7 is a flowchart showing the flow of a method for inspecting the switch circuit 200. First, a DC voltage is applied to the terminals 11, 21 and 31 (S11). Resistance between the source and the drain of the transistor T21 is measured in ON state. Resistance between the source and the drain of the transistor T21 is measured in OFF state as well (S21). Further, other DC characteristics of the transistor T21 are measured.

Subsequently, a DC voltage is applied to the terminals 11, 22 and 32 (S31). Resistance between the source and the drain of the transistor T22 is measured in ON state. In OFF state as well, resistance between the source and the drain of the transistor T22 is measured (S41). Further, other DC characteristics of the transistor T22 are measured. Thereby, it can be determined whether the switch circuit 200 is acceptable. For inspection of the transistors T21 and T22, current values may be measured instead of resistance values.

Similarly to the switch circuit 100 shown in FIG. 5, the switch circuit 200 according to the second embodiment has isolation characteristics nearly equal to those of conventional resonant-type switch circuits. Nevertheless, the transistors T21 and T22 thereof can be checked individually by measurement of DC characteristics. That is, although the switch circuit 200 is of a resonant type, it can be inspected by measurement of DC characteristics like the shunt-type switch circuit, and it does not need RF measurement required for inspection of conventional resonant-type switch circuits. Further, the switch circuit 200 has the same effects as those of the first embodiment.

THIRD EMBODIMENT

Figure 8:
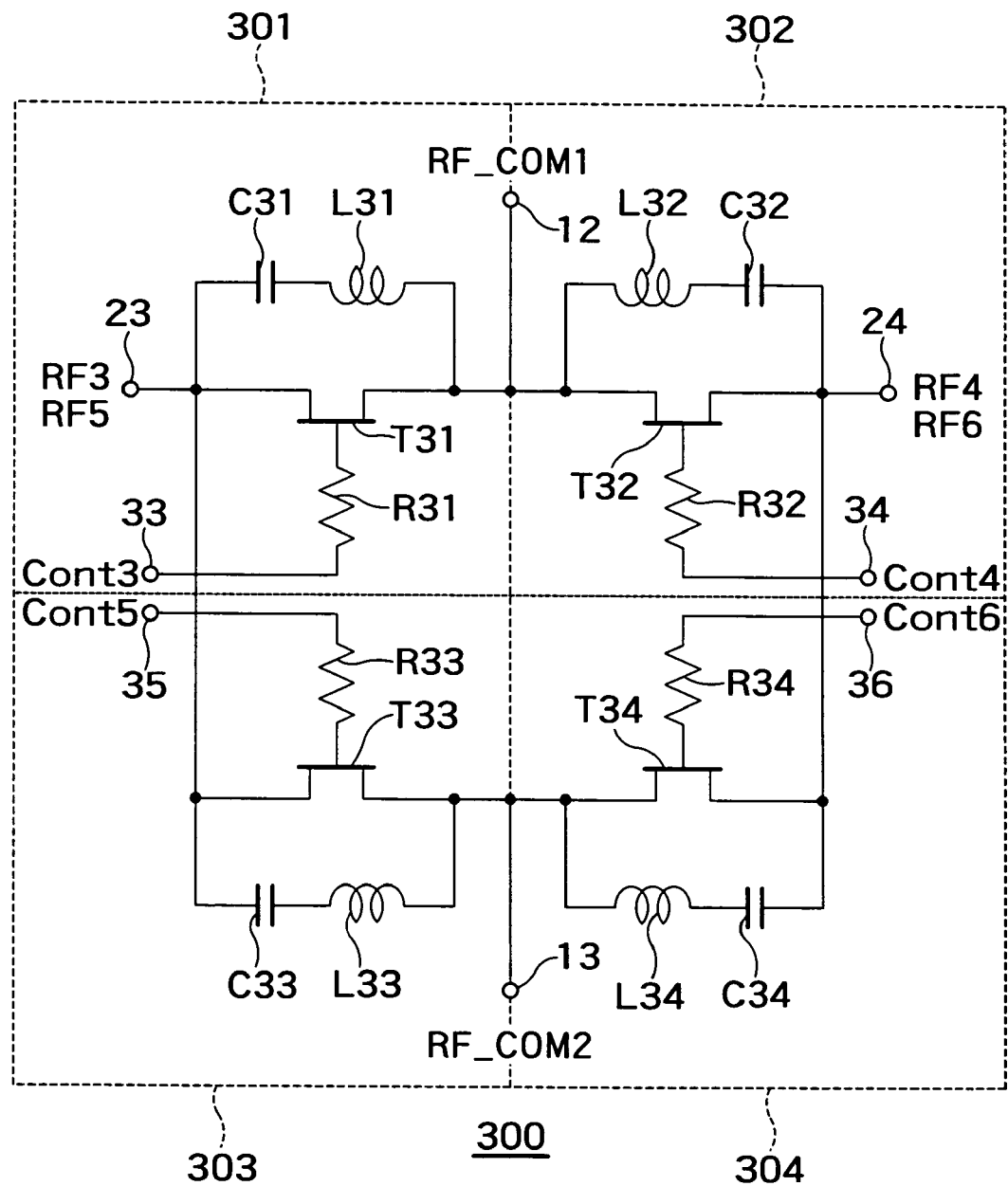
FIG. 8 is a circuit diagram of a resonant-type DPDT (double-pole double-through) switch circuit 300 according to the third embodiment of the invention.

FIG. 8 is a circuit diagram of a resonant-type DPST (double-pole single-throw) switch circuit 300 (simply called "switch circuit 300" hereunder) according to the third embodiment of the invention. The switch circuit 300 is composed of circuit sections 301, 302, 303 and 304, each having the same configuration as the switch circuit 100. The circuit sections 301 and 302 commonly use a terminal 12, and the circuit sections 303 and 304 commonly use a terminal 13. The circuit sections 301, 302, 303 and 304 include transistors T31, T32, T33 and T34, respectively, each corresponding to the transistor T10 in the switch circuit 100. The circuit sections 301, 302, 303 and 304 include inductors L31, L32, L33 and L34, respectively, each corresponding to the transistor L10 in the switch circuit 100. The circuit divisions 301, 302, 303 and 304 include capacitors C31, C32, C33 and C34, respectively, each corresponding to the capacitor C10 in the switch circuit 100. Further, the switch circuits 301, 302, 303 and 304 have resistors R31, R32, R33 and R34, respectively, each corresponding to the resistor R10 in the switch circuit 100.

The switch circuit 300 introduces a signal RF_COM1 through the terminal 12 and outputs a signal RF3 or RF4 from a terminal 23 or 24 thereof in response to a control signal Cont3 or Cont4. Alternatively, the switch circuit 300 introduces the signal RF3 or RF4 through the terminal 23 or 24, and outputs the signal RF_COM1 from the terminal 12 in response to the control signal Cont3 or Cont4.

The switch circuit 300 introduces a signal RF_COM2 through the terminal 13 and outputs a signal RF5 or RF6 from a terminal 23 or 24 thereof in response to a control signal Cont5 or Cont6. Alternatively, the switch circuit 300 introduces the signal RF5 or RF6 through the terminal 23 or 24, and outputs the signal RF_COM2 from the terminal 13 in response to the control signal Cont5 or Cont6.

Since the capacitors C31 to C34 are provided in the switch circuit 300, the flows of DC current to the inductors L31 to L34 are interrupted. That is, DC signals supplied between the terminals 12 and 23 cannot flow between the terminals 12 and 23 unless they pass through the transistor T31. DC signals supplied between the terminals 12 and 24 cannot flow between the terminals 12 and 24 unless they pass through the transistor T32. DC signals supplied between the terminals 13 and 23 cannot flow between the terminals 13 and 23 unless they pass through the transistor T33. Further, DC signals supplied between the terminals 13 and 24 cannot flow between the terminals 13 and 24 unless they pass through the transistor T34.

Figure 9:
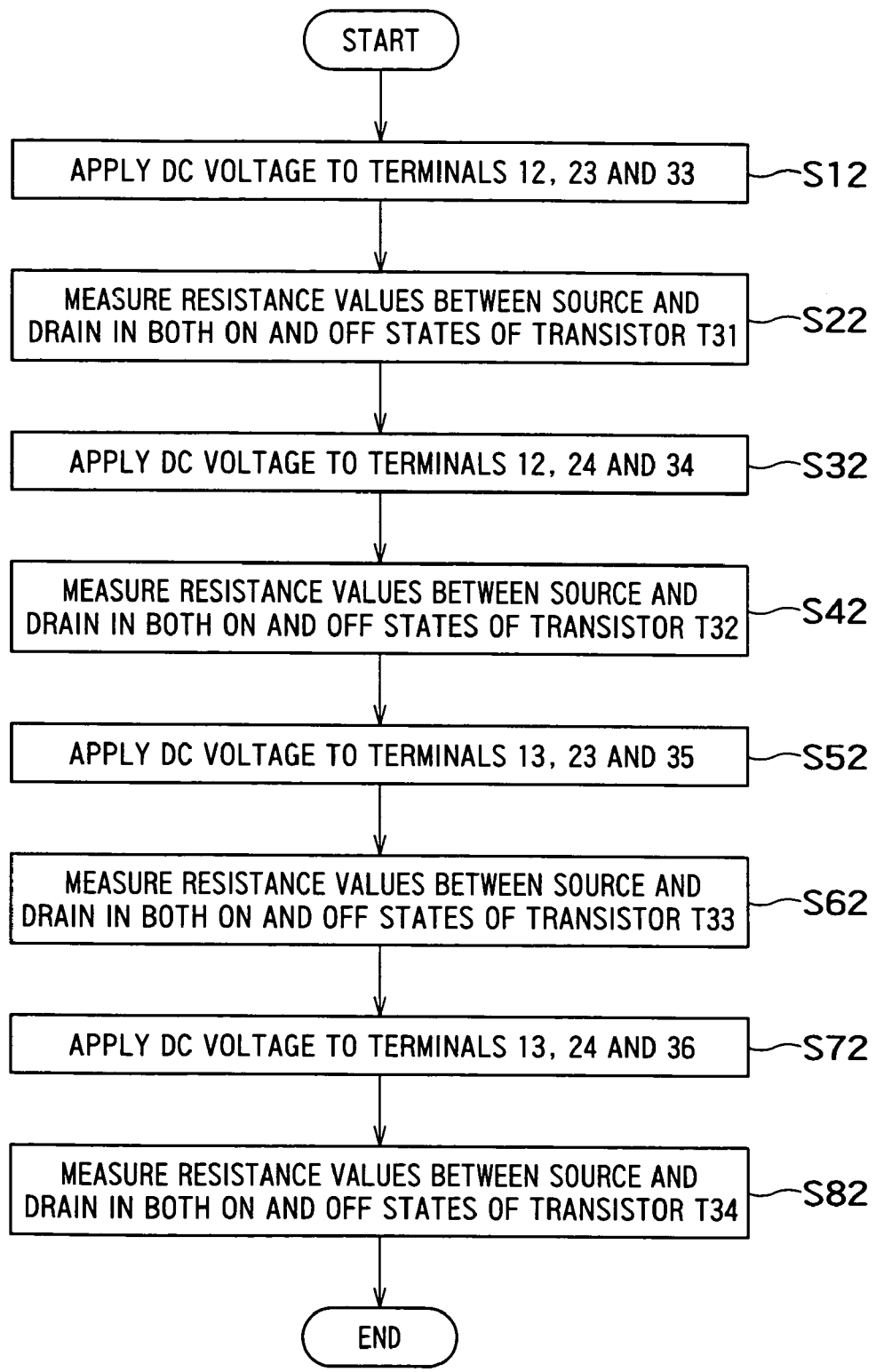
FIG. 9 is a flowchart showing the flow of a method of inspecting the switch circuit 300.

FIG. 9 is a flowchart showing the flow of a method for inspecting the switch circuit 300. First, a DC voltage is applied to the terminals 12, 23 and 33 (S12). Resistance between the source and the drain of the transistor T31 is measured in ON state. Resistance between the source and the drain of the transistor T31 is measured in OFF state as well (S22). Further, other DC characteristics of the transistor T31 are measured.

Subsequently, a DC voltage is applied to the terminals 12, 24 and 34 (S32). Resistance between the source and drain of the transistor T32 is measured in ON state. Resistance between the source and drain of the transistor T32 is measured in OFF state (S42). Further, other DC characteristics of the transistor T32 are measured.

Subsequently, a DC voltage is applied to the terminals 13, 23 and 35 (S52). Resistance between the source and the drain of the transistor T33 is measured in ON state. Resistance between the source and the drain of the transistor T33 is measured in OFF state as well (S62). Further, other DC characteristics of the transistor T33 are measured.

Furthermore, a DC voltage is applied to the terminals 13, 24 and 36 (S72). Resistance between the source and the drain of the transistor T34 is measured in ON state. Resistance between the source and the drain of the transistor T34 is measured in OFF state as well (S82). Further, other DC characteristics of the transistor T34 are measured. For inspection of the transistors T31 to T34, current values may be measured instead of resistance values.

Similarly to the switch circuit 100 shown in FIG. 5, the switch circuit 300 according to the third embodiment has isolation characteristics nearly equal to those of conventional resonant-type switch circuits. Nevertheless, the transistors T31 to T34 thereof can be checked by measurement of DC characteristics. That is, although the switch circuit 300 is of a resonant type, it can be inspected by measurement of DC characteristics like the shunt-type switch circuit, and it does not need by RF measurement required for the inspection of conventional resonant-type switch circuits. Therefore, it is possible to eliminate the cost for RF evaluation, which has heretofore shared the majority of the manufacturing cost.

In the first to third embodiments having been described above, the circuit components may be formed on a common semiconductor substrate. It should be noted that the invention is applicable not only to the first to third embodiments but also to all radio-frequency switch circuits using FETs.

FOURTH EMBODIMENT

Figure 10:
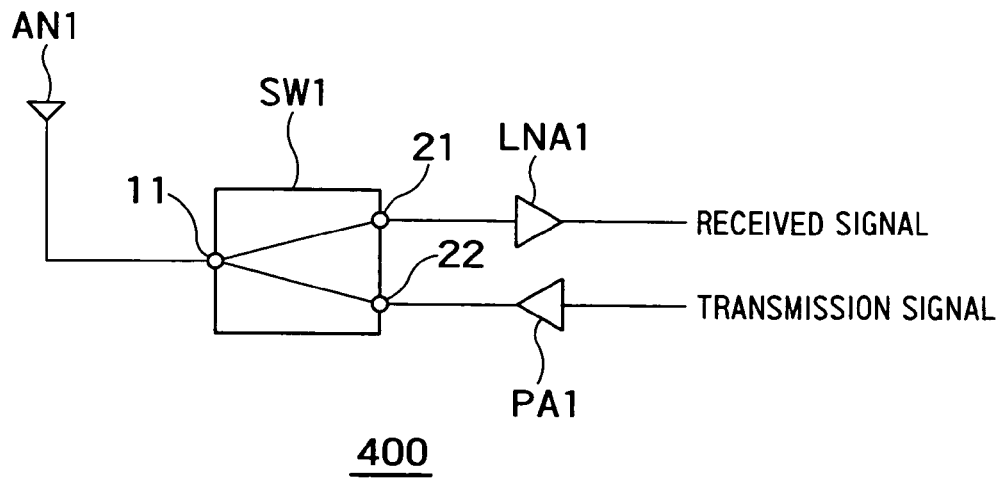
FIG. 10 is a circuit diagram of a part of a communication device 400 according to the fourth embodiment of the invention.

FIG. 10 is a circuit diagram of a part of a communication device according to the fourth embodiment of the invention. The communication device 400 includes an antenna AN1, switch circuit SW1, low-noise amplifier LNA1, and power amplifier PA1.

The switch circuit SW1 includes the switch circuit 200 shown in FIG. 5, for example. In case the switch circuit 200 is used in the switch circuit SW1, the antenna AN1 is connected to the terminal 11, the low-noise amplifier LNA1 is connected to the terminal 21, and the power amplifier PA1 is connected to the terminal 22.

When the communication device 400 receives a signal via the antenna AN1, the transistor T21 is turned ON. As a result, the transistor T21 permits the received signal to pass from the terminal 11 to the terminal 21 and delivers the signal to the low-noise amplifier LNA1. The low-noise amplifier LNA1 amplifies the received signal and forwards it to the internal circuit of the communication circuit 400.

When the communication device 400 transmits a signal via the antenna AN1, the signal is sent from the internal circuit of the communication device 400 to the power amplifier PA1, and amplified there. At this time, the transistor T22 turns ON. The transistor T22 allows the transmission signal, which is the signal amplified from the received signal by the power amplifier PA1, to pass from the terminal 22 to the terminal 11, and delivers it to the antenna AN1. As such, the communication device 400 can send and receive an RF signal via the antenna AN1.

The switch circuit SW1 can be inspected similarly to the second embodiment. Therefore, this fourth embodiment assures the same effects as those of the second embodiment.

FIFTH EMBODIMENT

Figure 11:
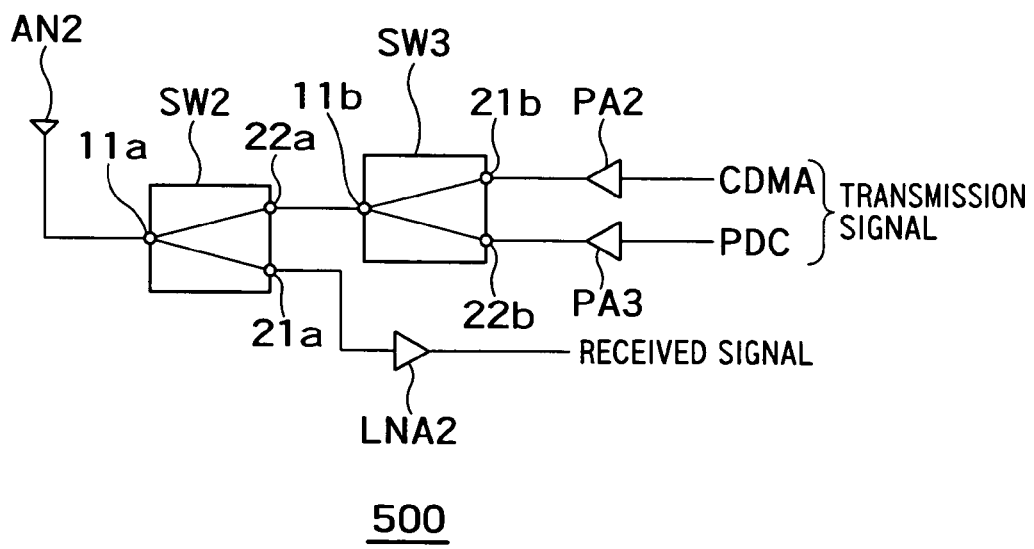
FIG. 11 is a circuit diagram of a part of a communication device 500 according to the fifth embodiment of the invention.

FIG. 11 is a circuit diagram of a part of a communication device 500 according to the fifth embodiment of the invention. The communication device 500 includes an antenna AN2, switch circuits SW2 and SW3, low-noise amplifier LNA2, and power amplifiers PA2 and PA3.

The switch circuits SW2 and SW3 each include the aforementioned switch circuit 200, for example. For easier explanation, the switch circuit 200 in the switch circuit SW2 will be referred to as "switch circuit 200a", and the terminals 11, 21 and 21 of the switch circuit 200a will be referred to as "terminals 11a, 21a and 21a", respectively. Similarly, the switch circuit 200 in the switch circuit SW3 will be referred to as "switch circuit 200b", and the terminals 11, 21 and 22 will be referred to as "terminals 11b, 21b and 22b", respectively. Further, the transistor T21 in the switch circuit 200a will be referred to as "transistor T21a", and the transistor T21 in the switch circuit 200b will be referred to as "transistor T21b".

The antenna AN2 is connected to the terminal 11a, the low-noise amplifier LNA2 to the terminal 21a, and the terminal 11b of the switch circuit SW3 to the terminal 22a. Further, the power amplifier PA2 is connected to the terminal 21b, and the power amplifier PA3 is connected to the terminal 22b.

In this embodiment, the power amplifier PA2 is used to send CDMA (code division multiple access) signals, and the power amplifier PA3 is used to send PDC (personal digital cellular) signals.

When the communication device 500 receives a signal via the antenna AN2, the transistor T21a turns ON. Thereby, the transistor T21a permits the received signal to pass from the terminal 11a to the terminal 21a, and delivers it to the low-noise amplifier LNA2. The low-noise amplifier LA2 amplifies the received signal, forwards it to the internal circuit of the communication device 500.

When the communication device 500 sends a CDMA signal, the signal is sent from the internal circuit of the communication device 500, and the signal is amplified by the power amplifier PA2. At this time, the transistor T21b in the switch circuit SW3 turns ON. The transistor T21b allows the transmission signal, which is the signal amplified by the power amplifier PA2, to pass from the terminal 21b to the terminal 11b, and forwards it to the switch circuit SW2.

When the communication device 500 sends a PDC signal, the signal is sent from the internal circuit of the communication device 500, and it is amplified by the power amplifier PA3. At this time, the transistor T22b turns ON in the switch circuit SW3. The transistor T22b permits the transmission signal, which is the signal amplified by the power amplifier PA3, to pass from the terminal 22b to the terminal 11b, and forwards it to the switch circuit SW2.

When the communication device 500 sends a CDMA or PDC signal, the transistor T22a turns ON in the switch circuit SW2. Thereby, the transistor T22a permits the transmission signal supplied from the switch circuit SW3 to pass from the terminal 22a to 11a, and forwards it to the antenna AN2. As such, the communication device 500 can send and receive RF signals via the antenna AN2.

The switch circuits SW2 and SW3 can be inspected similarly to the second embodiment. Therefore, the fifth embodiment ensures the same effects as those of the second embodiment.

SIXTH EMBODIMENT

Figure 12:
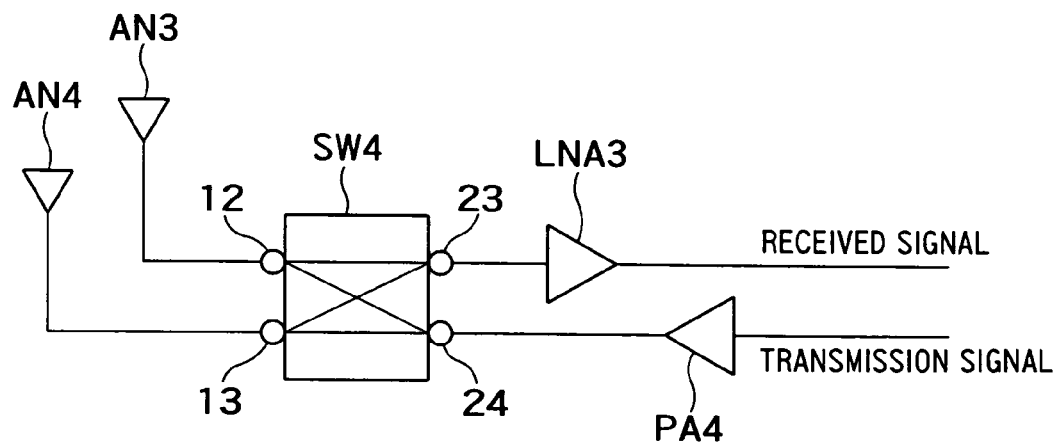
FIG. 12 is a circuit diagram of a part of a communication device 600 according to the sixth embodiment of the invention.
Figure 13:
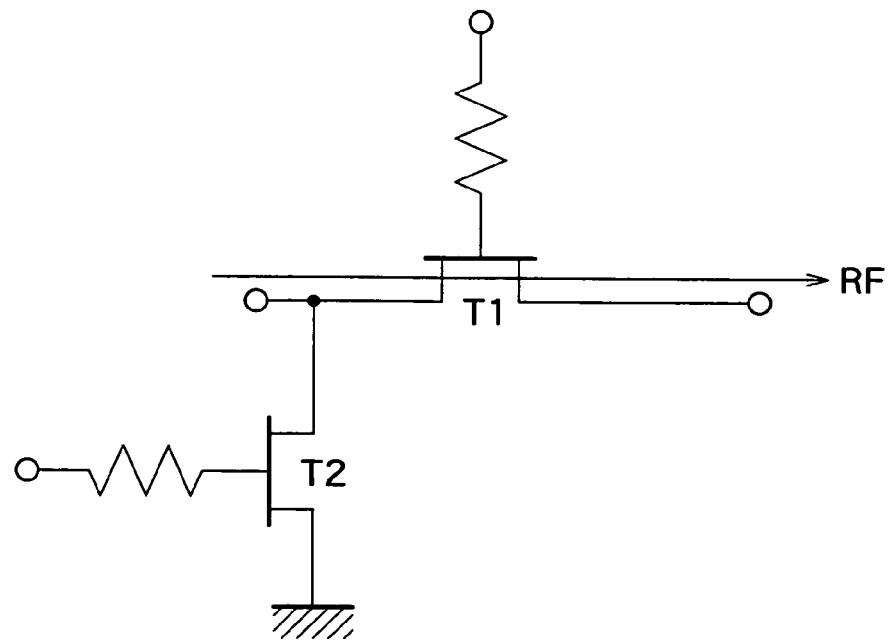
FIG. 13 is a circuit diagram of a typical conventional shunt-type SPST switch circuit.

FIG. 12 is a circuit diagram showing a part of a communication device 600 according to the sixth embodiment of the invention. The communication device 600 includes antennas AN3 and AN4, switch circuit SW4, low-noise amplifier LNA3 and power amplifier PA4.

The switch circuit SW4 includes the switch circuit 300, for example. The antenna AN2 is connected to the terminal 12, the antenna AN4 is connected to the terminal 13, the low-noise amplifier LNA3 is connected to the terminal 23, and the power amplifier PA4 is connected to the terminals 24.

When the communication device 600 receives a signal via the antenna AN3, the transistor T31 turns ON. Thereby, the transistor T31 permits the received signal to pass from the terminal 12 to the terminal 23, and forwards the signal to the low-noise amplifier LNA3. The low-noise amplifier LNA3 amplifies the received signal, and forwards it to the internal circuit of the communication device 600.

The communication device 600 may receive a signal via the antenna AN4. In this case, the transistor T33 turns ON. Thereby, the transistor T33 permits the received signal to pass from the terminal 13 to the terminal 23, and forwards the received signal to the low-noise amplifier LNA3. The low-noise amplifier LNA3 amplifies the received signal, and forwards it to the internal circuit of the communication device 600.

When the communication device 600 transmits a signal, the signal is sent from the internal circuit of the communication device 600, and it is amplified by the power amplifier PA4. In this case, the transistor T34 turns ON in the switch circuit SW4. The transistor T34 permits the transmission signal, which is the signal amplified by the power amplifier PA4, to pass from the terminal 24 to the terminal 13, and forwards it to the antenna AN4.

The communication device 600 may send a signal via the antenna AN3. In this case, the transistor T32 turns ON in the switch circuit SW4. The transistor T32 permits the transmission signal, which is the signal amplified by the power amplifier PA4, to pass from the terminal 24 to the terminal 12, and forwards it to the antenna AN3. As such, the communication device 600 can send and receive RF signals via the antennas AN3 and AN4.

The switch circuit SW4 can be inspected similarly to the third embodiment. Therefore, this embodiment ensures the same effects as those of the third embodiment.

The fourth to sixth embodiments of the invention are applicable not only to mobile communication devices but also to wireless LANs following the standards IEEE 802.11a, 802.11g, etc.

SEVENTH EMBODIMENT

Figure 15:
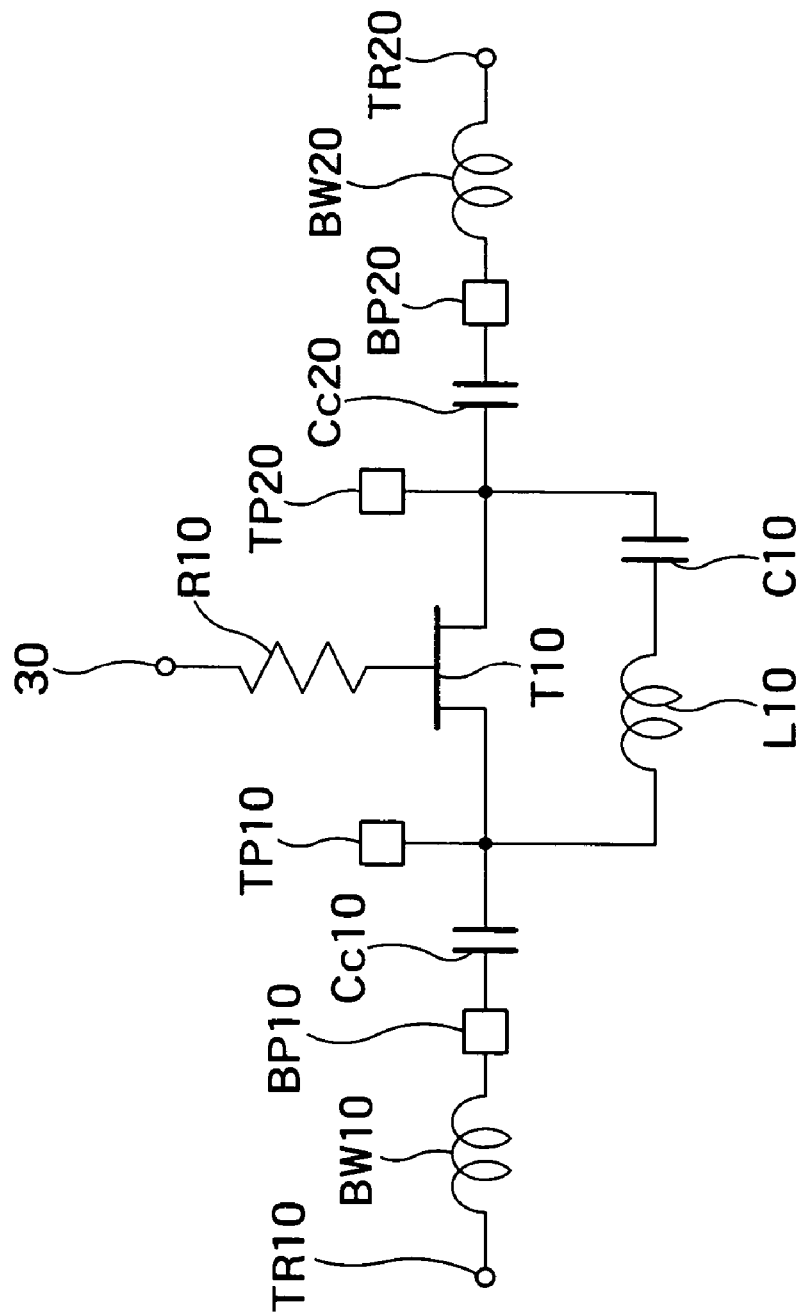
FIG. 15 is a circuit diagram of a switch circuit 110 according to the seventh embodiment of the invention.

FIG. 15 is a circuit diagram of a switch circuit 110 according to the seventh embodiment of the invention. The switch circuit 110 corresponds to the SPST switch circuit shown in FIG. 1.

A bonding pad BP10 and a terminal TR10 of a semiconductor package are connected to each other by a bonding wire BW10. Further, a bonding pad BP20 and a terminal TR20 of a semiconductor package are connected to each other by a bonding wire BW20.

Parasitic inductances of the bonding wires BW10 and BW20 affect a characteristic of the switch circuit when the switch circuit receives a high-frequency signal of 500 MHz or more. When each of the parasitic inductances of the bonding wires BW10 and BW20 are, for example, 1.0 nH, an imaginary component X (X=wL) in the impedance Z (Z=R+jX) of the switch circuit 110 for a high-frequency signal of 5.2 GHz becomes 32.7. The ON resistance of the transistor T10 is 4 ohm. Therefore, a degree |Z| ($|Z|=R^2+L^2)^{1/2}$) of the impedance Z becomes 32.9. This means that the degree |Z| depends on the inductances L of bonding wires BW10 and BW20. That is, an insertion loss is caused mostly by the bonding wires BW10 and BW20.

In order to reduce the insertion loss, a capacitor Cc10 is connected in serial between the transistor T10 and the bonding pad BP10, and a capacitor Cc20 is connected in serial between the transistor T10 and the bonding pad BP20.

In such a switch circuit, since the capacitors Cc10 and Cc20 prevent a direct current from flowing through the transistor T10, it is impossible to inspect DC characteristics of the transistor T10 by using the bonding pad BP10 and BP20.

Therefore, in the seventh embodiment, a test pad TP10 is connected at a node between the capacitor Cc10 and the transistor T10, and a test pad TP20 is connected at a node between the capacitor Cc20 and the transistor T10.

Since the test pads TP10 and TP20 are not used as bonding pads, the size of each of the test pads TP10 and TP20 may be sufficiently small as long as a testing probe can contact thereto. Therefore, the test pads TP10 and TP20 may be smaller than the bonding pads BP10 and BP20.

The test pads TP10 and TP20 are connected to the source electrode and the drain electrode of the transistor T10 without passing through the capacitors Cc10 and Cc20. As a result, even if the switch circuit 110 is provided with the capacitors Cc10 and Cc20, it becomes possible to inspect the DC characteristics of the transistor T10.

EIGHTH EMBODIMENT

Figure 16:
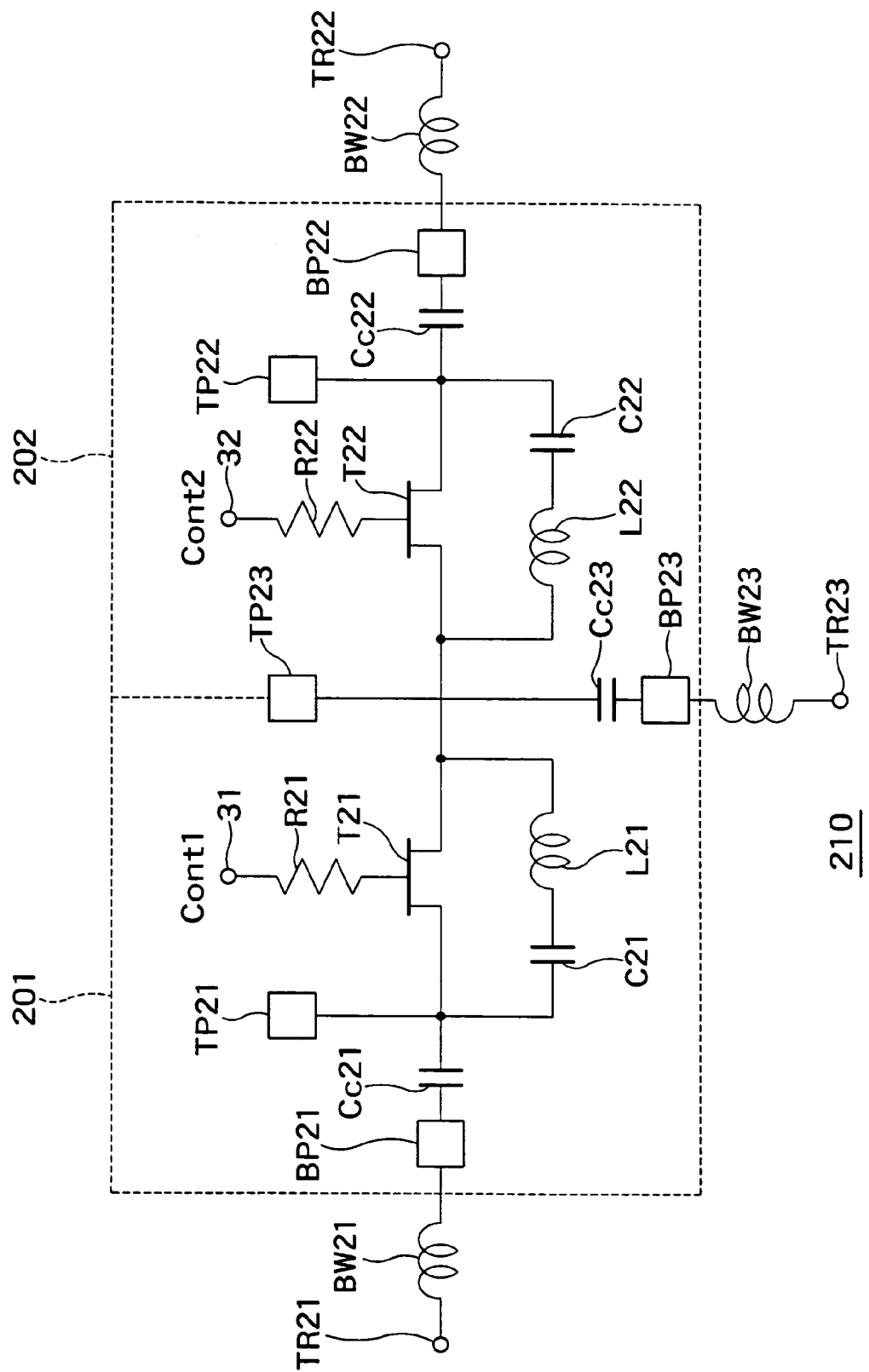
FIG. 16 is a circuit diagram of a switch circuit 210 according to the eighth embodiment of the invention.

FIG. 16 is a circuit diagram of a switch circuit 210 according to the eighth embodiment of the invention. The switch circuit 210 corresponds to the SPDT switch circuit shown in FIG. 6.

According to the eighth embodiment, in order to reduce an insertion loss of bonding wires BW21 to BW23, a capacitor Cc21 is connected in serial between a transistor T21 and a bonding pad BP21, a capacitor Cc22 is connected in serial between a transistor T22 and a bonding pad BP22, and a capacitor Cc23 is connected in serial between a transistor T21 or T22 and a bonding pad BP23.

A test pad TP21 is connected to a node between the capacitor Cc21 and the transistor T21, and a test pad TP22 is connected to a node between the capacitor Cc22 and the transistor T22. Further, a test pad TP23 is connected to a node between the transistors T21 and T22. Meanwhile, components of bonding pads and MIM capacitances are important, therefore, spiral inductances and transistors are schematically drawn in FIG. 18.

Since the test pads TP21 to TP23 are not used as bonding pads, the size of each test pad of TP21 to TP23 may be sufficiently small as long as a testing probe can contact thereto. Therefore, the test pads TP21 to TP23 may be smaller than the bonding pads BP21 and BP22.

The test pads TP21 and TP23 are connected to the source electrode and the drain electrode of the transistor T21 without passing through the capacitors Cc21 and Cc23. The test pads TP22 and TP23 are connected to the source electrode and the drain electrode of the transistor T22 without passing through the capacitors Cc22 and Cc23. As a result, even if the switch circuit 210 is provided with the capacitors Cc21 and Cc22, it becomes possible to inspect the DC characteristics of the transistors T21 and T22 by executing the inspecting method shown in FIG. 7 with the test pads TP21 to TP23.

NINTH EMBODIMENT

Figure 17:
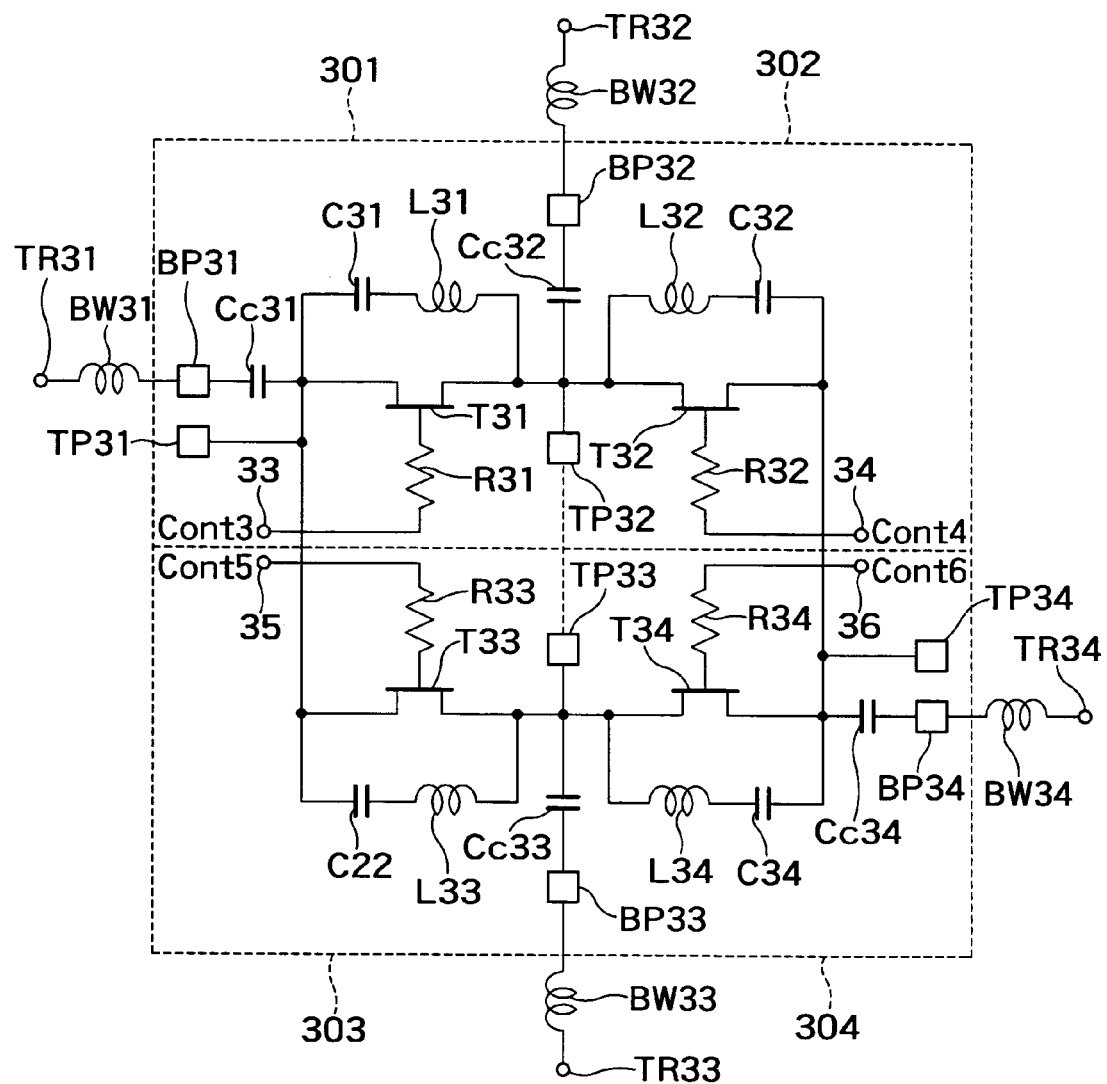
FIG. 17 is a circuit diagram of a switch circuit 310 according to the ninth embodiment of the invention.

FIG. 17 is a circuit diagram of a switch circuit 310 according to the ninth embodiment of the invention. The switch circuit 310 corresponds to the DPDT switch circuit shown in FIG. 8.

According to the ninth embodiment, in order to reduce an insertion loss of bonding wires BW31 to 34, a capacitor Cc31 is connected in serial between a transistor T31 and a bonding pad BP31, a capacitor Cc32 is connected in serial between a transistor T32 and a bonding pad BP32, a capacitor Cc33 is connected in serial between a transistor T33 and a bonding pad BP33, and a capacitor Cc34 is connected in serial between a transistor T34 and a bonding pad BP34.

A test pad TP31 is connected to a node between the capacitor Cc31 and the transistor T31, a test pad TP32 is connected to a node between the capacitor Cc32 and the transistor T32, a test pad TP33 is connected to a node between the capacitor Cc33 and the transistor T33, and a test pad TP34 is connected to a node between the capacitor Cc34 and the transistor T34.

Since the test pads TP31 to TP34 are not used as bonding pads, the sizes of each test pad of TP31 to TP34 may be sufficiently small as long as a testing probe can contact thereto. Therefore, the test pads TP31 to TP34 may be smaller than the bonding pads BP31 to BP34.

The test pads TP31 and TP32 are connected to the source electrode and the drain electrode of the transistor T31 without passing through the capacitor Cc31 and Cc33. The test pads TP32 and TP34 are connected to the source electrode and the drain electrode of the transistor T32 without passing through the capacitors Cc32 and Cc34. The test pads TP31 and TP33 are connected to the source electrode and the drain electrode of the transistor T33 without passing through the capacitor Cc31 and Cc33. The test pads TP33 and TP34 are connected to the source electrode and the drain electrode of the transistor T34 without passing through the capacitors Cc33 and Cc34. As a result, even if the switch circuit 310 is provided with the capacitors Cc31 to Cc34, it becomes possible to inspect the DC characteristics of the transistors T31 to T34 by executing the inspecting method shown in FIG. 9 with the test pads TP31 to TP34.

TENTH EMBODIMENT

Figure 18:
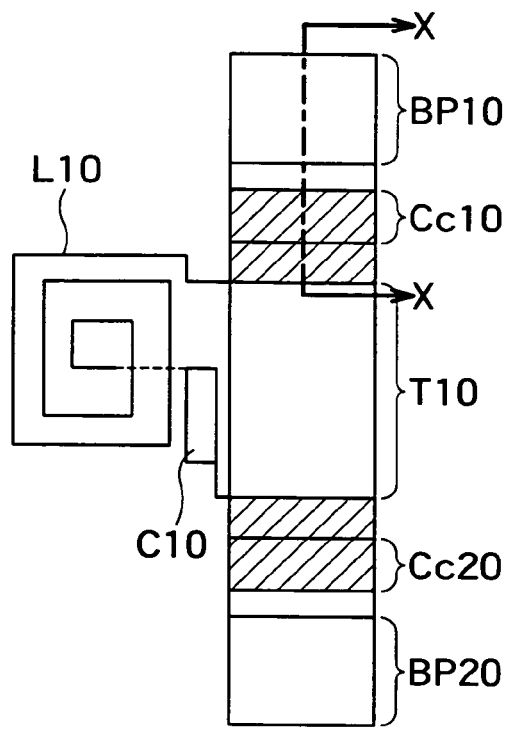
FIG. 18 is a layout diagram of a switch circuit 120 having no test pad TP10 and TP20.
Figure 19:
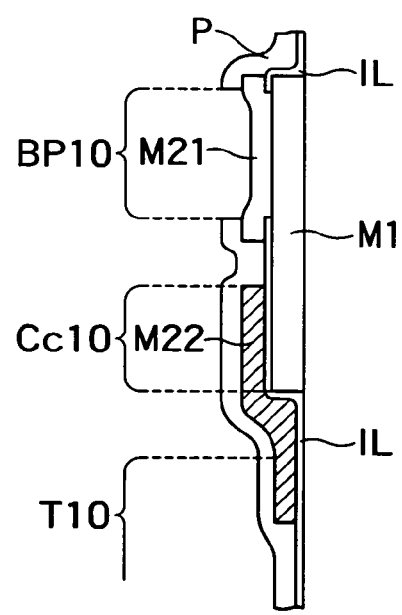
FIG. 19 is a cross-sectional view of the switch circuit 120 taken along the X-X line in FIG. 18.

FIG. 18 is a schematic layout diagram of a switch circuit 120 having no test pad. Other elements of the switch circuit 120 may be same as the elements of the SPST switch circuit 110. FIG. 19 is a cross-sectional view taken along with X-X line of FIG. 18.

According to the tenth embodiment, even if the test pads TP10 and TP20 are eliminated from the switch circuit 110, it is possible to inspect the DC characteristics of the transistor T10.

In representative, the capacitor Cc10 is constructed in a MIM (Metal-Insulator-Metal) form. Therefore, when the switch 120 is manufactured on a semiconductor wafer, at least two metal layers should be deposited on the semiconductor wafer.

Figure 20:
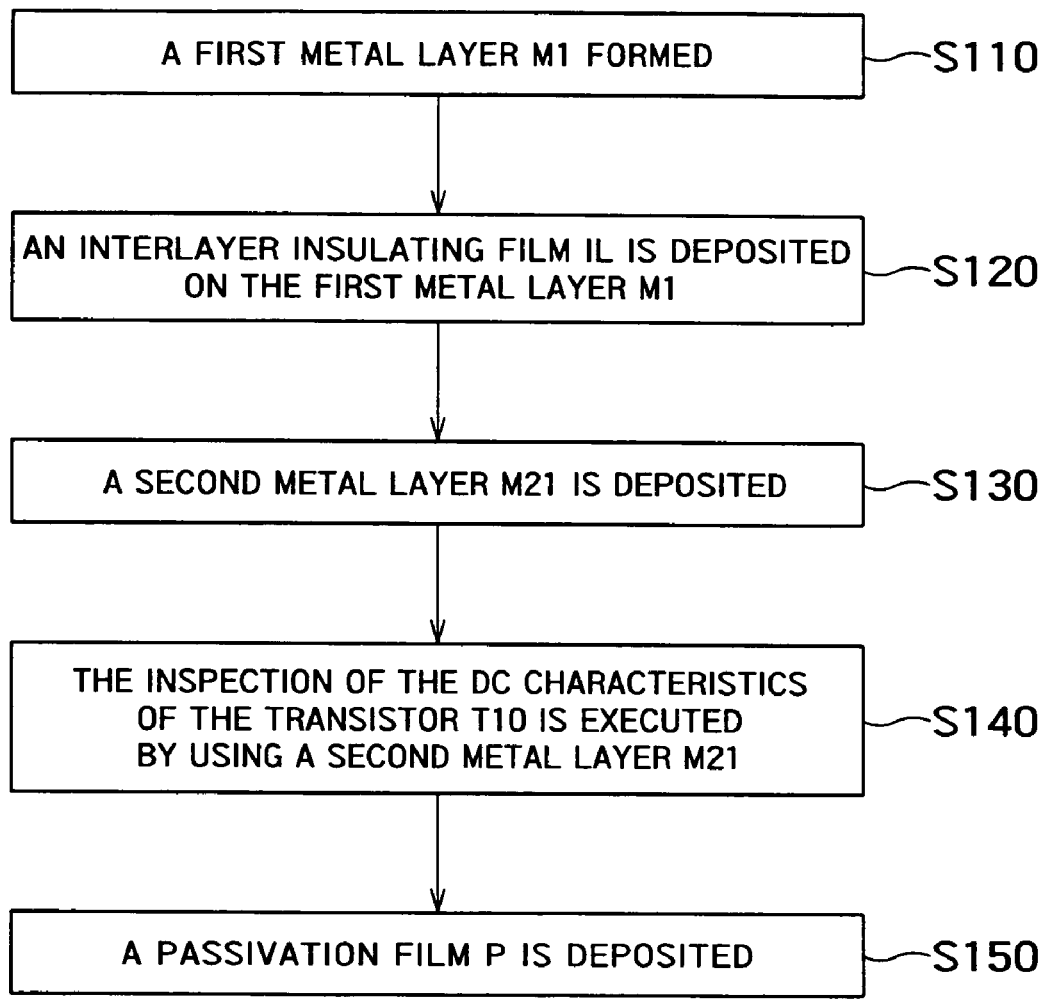
FIG. 20 is a flow diagram of manufacturing process from a metal layer to a passivation film.

FIG. 20 is a flow diagram of manufacturing process from a metal layer to a passivation layer. Firstly, a first metal layer M1 formed (S110). Then, an interlayer insulating film IL is deposited on the first metal layer M1 (S120). Through a photolithography process and an etching process, a part of the interlayer insulating film IL lying on the bonding pad BP10 is removed. Then, a second metal layer M21 is deposited (S130). Through a photolithography process and an etching process, a second metal layer M21, which is a part of the second metal layer, is formed on the bonding pad BP10, and a second metal layer M22, which is another part of the second metal layer, is formed on the capacitor Cc10. Further, a second metal layer M22 is connected to an electrode of the transistor T10. The first and the second metal layers are also formed in the region of the capacitor Cc20 same as in the region on the capacitor Cc10.

Then, the inspection of the DC characteristics of the transistor T10 is executed (S140). The metal layer M22 indicated by oblique line in FIGS. 18 and 19 acts as an electrode of the capacitor Cc10 and act as an electrode of the transistor T10. Therefore, the testing probe can apply a DC signal to the electrode of the transistor T10 by contacting a testing probe to the second metal layer M22. It is, also, possible to contact to one of electrodes of the capacitor Cc20 with a testing probe. Therefore, the DC characteristics of the transistor T10 can be inspected by using the second metal.

After the inspection of the DC characteristics, a passivation film P is deposited on the semiconductor wafer (S150). Through a photolithography process and an etching process, parts of the passivation film P on the bonding pad BP10 and BP20 are removed. At this time, since the inspection of DC characteristics is finished, the passivation film P may lay on the second metal layer M22.

According to the tenth embodiment, the inspection of DC characteristics of the switch circuit 120 may be executed before depositing the passivation layer P on the semiconductor wafer on which the switch circuit 120 is manufactured. As a result, even if the switch circuit 120 has no test pads, it is possible to inspect the DC characteristics of the switch circuit 120. This may be applied to the switch circuits 210 and 310 in FIGS. 16 and 17.

In the description of the above embodiments, a high frequency signal means a radio signal having a frequency of 500 MHz or more.

What is claimed is:

1. A semiconductor device comprising:
    a semiconductor switching element having a first electrode, a second electrode and a third electrode, and permitting a high-frequency signal to pass through between the first electrode and the second electrode, depending upon the potential of the third electrode, bias voltages at the first and second electrodes being substantially equal; and
    an inductor element and a capacitor element which are connected in series to each other and are connected in parallel with respect to the semiconductor switching element at the first and the second electrodes,
    wherein the capacitor element is used to inspect a DC characteristic of the semiconductor switching element by interrupting a flow of DC current through the inductor element.

2. A semiconductor device according to claim 1, wherein two of the semiconductor switching elements are connected in serial to each other; and
    wherein the inductor elements and the capacitor elements are connected in parallel to each of the semiconductor switching elements;
    the semiconductor device further comprising:
    an input terminal provided between the two semiconductor switching elements and commonly used by the two semiconductor switching elements to receive a high-frequency signal.

3. A semiconductor device according to claim 1, wherein the semiconductor switching element is a field effect transistor.

4. A semiconductor device according to claim 1, wherein the semiconductor switching element is an HEMT.

5. A semiconductor device according to claim 2, wherein the semiconductor switching element is an HEMT.

6. A semiconductor device according to claim 1, wherein the capacitance of the capacitor element is larger than the capacitance between the first and second electrodes when the semiconductor switching element is in OFF state.

7. A semiconductor device according to claim 2, wherein the capacitance of the capacitor element is larger than the capacitance between the first and second electrodes when the semiconductor switching element is in OFF state.

8. A communication device comprising:
    an antenna;
    a first semiconductor switching element having a first electrode, a second electrode and a third electrode, and permitting a high-frequency signal received at the first electrode through the antenna to pass through to the second electrode, depending upon the potential of the third electrode, bias voltages at the first and second electrodes being substantially equal;
    a first inductor element and a first capacitor element which are connected in series to each other and are connected in parallel with respect to the first semiconductor switching element;
    a received signal amplifier which amplifies the received signal supplied from the second electrode;
    a transmission signal amplifier which amplifies a high-frequency transmission signal;

a second semiconductor switching element having a fourth electrode, a fifth electrode and a sixth electrode, and permitting the transmission signal introduced from the transmission signal amplifier to the fourth electrode to pass through to the fifth electrode, depending upon the potential of the sixth electrode, and further from the fifth electrode to the antenna, bias voltages at the fourth electrode and the fifth electrode being substantially equal; and a second inductor element and a second capacitor element which are connected in series to each other and are connected in parallel to the second semiconductor switching element, wherein the first capacitor element is used to inspect a DC characteristic of the first semiconductor switching element by interrupting a flow of DC current through the first inductor element, and wherein the second capacitor element is used to inspect a DC characteristic of the second semiconductor switching element by interrupting a flow of DC current through the second inductor element.

9. A communication device according to claim 8, wherein an electrode commonly serves as both the first and fifth electrodes.

10. A communication device according to claim 8, wherein the semiconductor switching element is a field effect transistor.

11. A communication device according to claim 8, wherein the semiconductor switching element is an HEMT.

12. A communication device according to claim 8, wherein the capacitance of the capacitive element is larger than that between the first and second poles when the switching element is in OFF state.

13. A semiconductor device comprising:
a first semiconductor switching element having a first electrode, a second electrode and a third electrode, and permitting a high-frequency signal to pass through between the first electrode and the second electrode, depending upon the potential of the third electrode, bias voltages at the first and second electrodes being substantially equal;
a first bonding pad coupled to the first electrode;
a second bonding pad coupled to the second electrode;
a first capacitor element connected in serial between the first electrode and the first bonding pad;
a second capacitor element connected in serial between the second electrode and the second bonding pad;
a first test pad connected to a node between the first capacitor element and the first electrode;
a second test pad connected to a node between the second capacitor element and the second electrode; and
a first inductor element and a third capacitor element which are connected in series to each other and are connected in parallel with respect to the first semiconductor switching element at the first and the second electrodes,
wherein the first capacitor element is used to inspect a DC characteristic of the first semiconductor switching element by interrupting a flow of DC current through the first inductor element.

14. The semiconductor device according to claim 13 further comprising:
a second semiconductor switching element having a fourth electrode, a fifth electrode and a sixth electrode, and permitting a high-frequency signal to pass through between the fourth electrode and the fifth electrode, depending upon the potential of the sixth electrode, bias voltages at the fourth and fifth electrodes being substantially equal;
a third bonding pad coupled to the fifth electrode;
a fourth capacitor element connected in serial between the fifth electrode and the third bonding pad;
a third test pad connected to a node between the fourth capacitor element and the fifth electrode; and
a second inductor element and a fifth capacitor element which are connected in series to each other and are connected in parallel with respect to the second semiconductor switching element at the fourth and the fifth electrodes;
wherein the fourth electrode is connected with the second electrode,
wherein the second capacitor element is used to inspect a DC characteristic of the second semiconductor switching element by interrupting a flow of DC current through the second inductor element.

15. The semiconductor device according to claim 13, wherein the first to the third test pads are smaller than the first to the third bonding pads.

16. The semiconductor device according to claim 14, wherein the first to the third test pads are smaller than the first to the third bonding pads.

17. The semiconductor device according to claim 13, wherein the first and the second semiconductor elements are HEMT.

18. The semiconductor device according to claim 14, wherein the first and the second semiconductor elements are HEMT.

* * * * *